(12) United States Patent
Veit et al.

(10) Patent No.: US 6,531,904 B1
(45) Date of Patent: *Mar. 11, 2003

(54) CIRCUIT CONFIGURATIONS HAVING A DELAY DEVICE, A MULTIPLIER, FILTER AND/OR A MASTER-SLAVE FLIP-FLOP FOR GENERATING: AN OUTPUT SIGNAL BEING ORTHOGONAL TO AN INPUT SIGNAL, AN OUTPUT SIGNAL HAVING A FREQUENCY BEING DOUBLE THAT OF AN INPUT SIGNAL, OR TWO OUTPUT SIGNALS BEING ORTHOGONAL TO ONE ANOTHER

(75) Inventors: Werner Veit, Unterhaching (DE); Josef Fenk, Eching (DE); Robert-Grant Irvine, München (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1164 days.

(21) Appl. No.: 08/653,306

(22) Filed: May 24, 1996

(30) Foreign Application Priority Data

May 24, 1995 (DE) .......................................... 195 19 156

(51) Int. Cl.$^7$ ................................................ H03B 19/00
(52) U.S. Cl. ...................................... 327/122; 327/254
(58) Field of Search ................................ 327/100, 113, 327/116, 119, 120, 122, 355, 356, 237, 238, 243, 254, 270, 114, 105, 255, 173, 280, 287; 377/47

(56) References Cited

U.S. PATENT DOCUMENTS

| | | | | |
|---|---|---|---|---|
| 3,808,517 A | | 4/1974 | Fletcher et al. ............. | 323/106 |
| 4,129,832 A | * | 12/1978 | Neal et al. ..................... | 331/44 |
| 4,207,528 A | * | 6/1980 | Sawai .......................... | 375/20 |
| 4,371,839 A | * | 2/1983 | Rubin ......................... | 329/104 |
| 5,015,872 A | * | 5/1991 | Rein .......................... | 327/202 |
| 5,066,877 A | * | 11/1991 | Hamano et al. ............. | 327/280 |
| 5,297,179 A | * | 3/1994 | Tatsumi ...................... | 327/122 |
| 5,461,335 A | * | 10/1995 | Tsuchiya .................... | 327/280 |

FOREIGN PATENT DOCUMENTS

| | | | |
|---|---|---|---|
| EP | 0 452 776 A2 | 10/1991 | |
| EP | 0 455 156 A2 | 11/1991 | |
| JP | 2-125515 | * 5/1990 | ................. 327/172 |
| JP | 3-136515 | * 6/1991 | ................. 327/116 |

OTHER PUBLICATIONS

Patent Abstracts of Japan No. 531 5888 (Miyake), dated Nov. 26, 1993.

Patent Abstracts of Japan No. 52 147943 (Suzuki), dated Aug. 12, 1977.

"Unity–Gain Frequency Independent Quadrature Phase Shifter", Electronics Letters, No. 10, London, 1984, pp. 431–432.

* cited by examiner

*Primary Examiner*—Kenneth B. Wells
(74) *Attorney, Agent, or Firm*—Laurence A. Greenberg; Werner H. Stemer; Ralph E. Locher

(57) ABSTRACT

A circuit configuration for generating an output signal orthogonal to an input signal includes a delay device having an input to which an input signal is applied, an output at which an output signal is available, and a control input for controlling a time lag. A multiplier device has inputs being coupled to the input and the output of the delay device and has an output. A device for low-pass filtering is connected between the output of the multiplier device and the control input of the delay device.

2 Claims, 1 Drawing Sheet

CIRCUIT CONFIGURATIONS HAVING A DELAY DEVICE, A MULTIPLIER, FILTER AND/OR A MASTER-SLAVE FLIP-FLOP FOR GENERATING: AN OUTPUT SIGNAL BEING ORTHOGONAL TO AN INPUT SIGNAL, AN OUTPUT SIGNAL HAVING A FREQUENCY BEING DOUBLE THAT OF AN INPUT SIGNAL, OR TWO OUTPUT SIGNALS BEING ORTHOGONAL TO ONE ANOTHER

BACKGROUND OF THE INVENTION

FIELD OF THE INVENTION

The invention relates to a circuit configuration for generating an output signal being orthogonal to an input signal, a circuit configuration for generating a signal having a frequency being double that of an input signal, and a circuit configuration for generating two output signals being orthogonal to one another.

Such circuit configurations are also known as 90° phase shifters, and are generally known in numerous forms. A problematic feature thereof is that configurations which require little expenditure for circuitry usually function optimally only at a frequency within a narrow range, while configurations that allow greater frequency fluctuations typically require high expenditure for circuitry.

SUMMARY OF THE INVENTION

It is accordingly an object of the invention to provide a circuit configuration for generating an output signal being orthogonal to an input signal, a circuit configuration for generating a signal having a frequency being double that of an input signal, and a circuit configuration for generating two output signals being orthogonal to one another, which overcome the hereinafore-mentioned disadvantages of the heretofore-known devices of this general type and which generate a constant 90° phase shift at less expenditure and in the presence of frequency fluctuations over a wide range.

With the foregoing and other objects in view there is provided, in accordance with the invention, a circuit configuration for generating an output signal orthogonal to an input signal, comprising a delay device having an input to which an input signal is applied, an output at which an output signal is available, and a control input for controlling a time lag; a multiplier device having inputs being coupled to the input and the output of the delay device and having an output; and a device for low-pass filtering being connected between the output of the multiplier device and the control input of the delay device.

In accordance with another feature of the invention, the delay device includes a capacitor having terminals at which the output signal can be picked up; two transistors being controlled inversely to one another by the input signal, the transistors having load paths each being connected between one terminal of the capacitor and a first supply potential; and two current sources being controlled by a signal applied to the control input and furnishing currents of equal magnitude, the sources each being connected between one terminal of the capacitor and a second supply potential.

With the objects of the invention in view there is also provided a circuit configuration for generating a signal having a frequency being double the frequency of an input signal, wherein a signal is supplied at twice the frequency of a signal at the output of the multiplier device.

With the objects of the invention in view there is additionally provided a circuit configuration for generating two output signals being orthogonal to one another, including a toggle flip-flop following the multiplier device and having outputs at which two output signals being orthogonal to one another are available.

In accordance with a concomitant feature of the invention, there is provided a device for band-pass filtering directly following the multiplier device.

Other features which are considered as characteristic for the invention are set forth in the appended claims.

Although the invention is illustrated and described herein as embodied in a circuit configuration for generating an output signal being orthogonal to an input signal, a circuit configuration for generating a signal having a frequency being double that of an input signal, and a circuit configuration for generating two output signals being orthogonal to one another, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
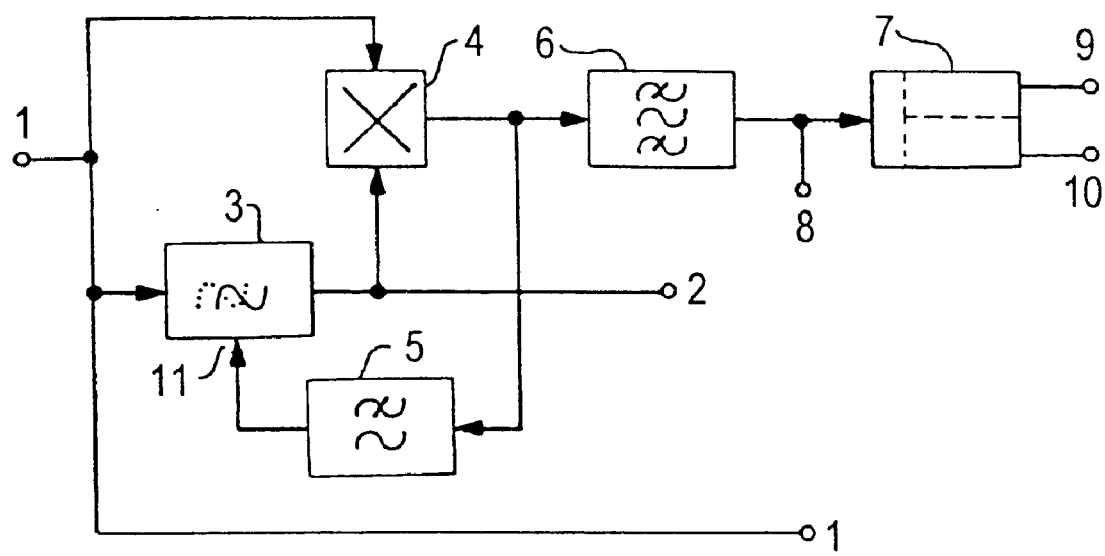
FIG. 1 is a block diagram of a basic embodiment of a circuit configuration according to the invention and its use.

Referring now to the figures of the drawings in detail and first, particularly, to FIG. 1 thereof, there is seen a circuit configuration according to the invention which includes a delay device 3, having an input to which an input signal 1 is applied and an output at which an output signal 2 is available. A time lag of the delay device 3 is variable through the use of a control signal applied to an input 11 thereof. The control signal is formed of the DC component of the product of the input signal 1 and the output signal 2. To that end, the input signal 1 and the output signal 2 are multiplied by one another through the use of a multiplier 4. The resultant product is subjected to low-pass filtering through the use of a low-pass filter 5 and is finally delivered to the control input 11 of the delay device 3.

For instance, if the input signal 1 has the course sin x, then in the ideal case the result for the output signal 2 is a course cos x. Multiplication of the input signal 1 by the output signal 2 produces a course sin 2x. In other words, the output signal 2 has only AC components. Conversely, in the non-ideal case, a signal is generated that includes not only an AC component but also a DC component. Through the use of the subsequent low-pass filtering, any DC component that might occur is extracted. If the time lag of the delay device 3 is not adjusted in such a way that a phase shift of 90° results, then the DC component in the output signal 2 is not equal to zero. The delay device 3, the multiplier device 4 and the low-pass filter 5 then form a closed-loop control circuit, which establishes a phase shift of 90° in the regulated state, regardless of the frequency of the input signal 1, by regulating the DC component in the output signal 2 to zero and thus adapting the time lag of the delay device 3 to the applicable frequency of the input signal 1.

Circuit configurations for generating an output signal that is orthogonal to an input signal are needed, for instance, in circuit configurations for doubling the frequency of the input signal 1. To that end, typically the input signal 1 and a signal orthogonal thereto, for instance, the output signal 2, are supplied to a multiplier. However, since the input signal 1 and output signal 2 are already multiplied by one another in the multiplier 4, it is possible to dispense with a further multiplier and instead to pick up the signal available at the output of the multiplier 4. Accordingly, an output signal that has twice the frequency of the input signal 1 already appears at the output of the multiplier 4.

According to a feature of the invention, the multiplier 4 is followed by a band-pass filter 6, in order to damp any undesired spectral components that might occur and that might be brought about by inaccuracies in the multiplier, for instance. An output signal 8 of the band-pass filter 6 thus has twice the frequency of the input signal 1, and practically no interfering spectral components are contained therein.

The circuit configuration for generating a signal having twice the frequency of the input signal 1 can also be used in a further application in such a way that the output signal 8 is supplied to a toggle flip-flop 7, having master and slave outputs at which respective output signals 9 and 10 are available. The output signals 9 and 10 are orthogonal to one another and each have half the frequency of the output signal 8. Thus, overall in this circuit configuration, two output signals 9, 10 which are of equal frequency and are orthogonal to one another are generated from the input signal 1. Their duty cycle in each case is exactly 1:1, if the phase shift between the input signal 1 and output signal 2 is 90°.

Toggle flip-flops in general are known, for instance from the book: Electronic Circuits - Design and Applications, by U. Tietze and C. Schenk, Springer-Verlag, Berlin, Heidelberg 1991, pp. 213–215. Toggle flip-flops with master and slave outputs particularly include two individual toggle flip-flops. Data inputs of the two flip-flops are connected to an output of the other respective flip-flop. A signal of a given frequency, for instance the signal 8, is inverted at one flipflop and applied noninverted to the other. Finally, two signals which are orthogonal to one another, each with half the frequency of the signal 8, are available at the outputs of the two flip-flops.

Figure 2:
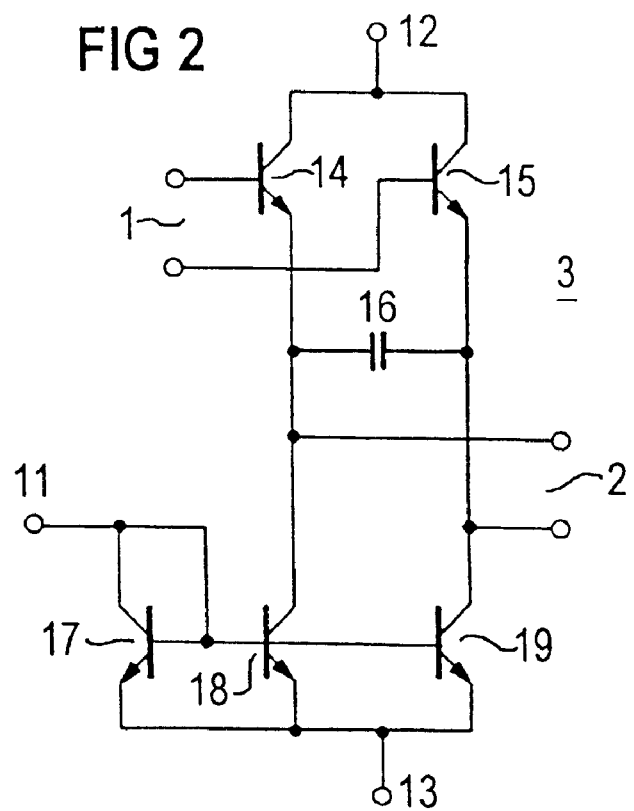
FIG. 2 is a schematic circuit diagram of a preferred embodiment of a controllable delay device in a circuit configuration according to the invention.

A controllable delay device 3 of FIG. 2 is preferably used in the circuit configuration of FIG. 1. The delay device 3, which is shown as an exemplary embodiment, includes a capacitor 16 having terminals at which the output signal 2 can be picked up in differential form. The terminals of the capacitor 16 are also connected through respective load paths of two transistors 14 and 15 to a supply potential 12, as well as through load paths of two further transistors 18 and 19 to a supply potential 13.

Bases of the two transistors 14 and 15 are controlled by the input signal 1, which is available in differential form. Bases of the two transistors 18 and 19 are connected to one another and to the input 11. In addition, a transistor 17 which is switched as a diode by interconnecting its base and collector, is connected between the interconnected bases of the transistors 18 and 19 on one hand, and the supply potential 13 on the other hand. The transistors 17, 18 and 19 form a current bank, or in other words a current mirror with one input branch and two output branches. The two output branches furnish two currents of equal magnitude, which are at a defined ratio to the current fed into the input 11. However, instead of a current bank, separate, identical current sources may be provided in the same way, which are triggered by a suitable current or a suitable voltage of the control input 11.

In the event that the preceding low-pass filter 5 furnishes a voltage instead of a current at its output, then correspondingly a voltage-to-current converter should be incorporated between the low-pass filter 5 and the delay device 3.

In the present exemplary embodiment, all of the transistors 14, 15, 17, 18, 19 are npn bipolar transistors. The supply potential 12 is positive, and the supply potential 13 is negative. According to a further feature of the invention, the transistors 14 and 15 are operated as emitter followers, in combination with current sources formed by the transistors 18, 19. On one hand, this mode of operation has the advantage of attaining a higher limit frequency of the delay device, since the two transistors 14 and 15 cannot enter saturation. On the other hand, the use of emitter followers makes it possible to apply even continuous analog signals as signals to be delayed, since there is no transfer region between the two transistors 14 and 15.

During dynamic operation of the delay device, the two mutually equal emitter currents of the transistors 14 and 15 determine the speed with which the capacitor 16 is charged in the opposite direction and consequently determine the time lag between the zero crossovers of the input signal 1 and the zero crossovers of the output signal 2.

We claim:

1. A circuit configuration for generating two output signals being orthogonal to one another, comprising:

a delay device having an input to which an input signal is applied, an output at which an output signal is available, and a control input for controlling a time lag;

a multiplier device having inputs being coupled to the input and the output of said delay device and having an output;

a device for low-pass filtering being connected between the output of said multiplier device and the control input of said delay device, said low-pass filter being directly connected to said delay device; and a master-slave toggle flip-flop following said multiplier device and having outputs at which two output signals being orthogonal to one another are available.

2. The circuit configuration according to claim 1, including a device for band-pass filtering directly following said multiplier device.

* * * * *